United States Patent
Eeh et al.

(10) Patent No.: US 10,468,170 B2
(45) Date of Patent: Nov. 5, 2019

(54) MAGNETIC DEVICE

(71) Applicant: TOSHIBA MEMORY CORPORATION, Minato-ku, Tokyo (JP)

(72) Inventors: Young Min Eeh, Seongnam-si (KR); Toshihiko Nagase, Tokyo (JP); Daisuke Watanabe, Yokkaichi Mie (JP); Kazuya Sawada, Seoul (KR); Tadaaki Oikawa, Seoul (KR); Kenichi Yoshino, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/919,576

(22) Filed: Mar. 13, 2018

(65) Prior Publication Data
US 2019/0080833 A1 Mar. 14, 2019

(30) Foreign Application Priority Data
Sep. 13, 2017 (JP) .................................. 2017-175925

(51) Int. Cl.
| H01F 10/32 | (2006.01) |
| H01L 43/08 | (2006.01) |
| H01L 43/10 | (2006.01) |
| H01F 41/30 | (2006.01) |
| H01L 43/12 | (2006.01) |
(Continued)

(52) U.S. Cl.
CPC ........ *H01F 10/3254* (2013.01); *G11C 11/161* (2013.01); *H01F 10/3268* (2013.01); *H01F 10/3286* (2013.01); *H01F 41/302* (2013.01); *H01L 43/08* (2013.01); *H01L 43/10* (2013.01); *H01L 43/12* (2013.01); *G11C 11/1657* (2013.01); *G11C 11/1673* (2013.01); *G11C 11/1675* (2013.01); *H01F 10/30* (2013.01)

(58) Field of Classification Search
CPC .......... G11C 11/161; G11C 2211/5615; G11C 2213/31; H01F 10/3286; H01F 10/22; H01F 10/126; H01F 10/1936; H01L 10/10; H01L 10/30
See application file for complete search history.

(56) References Cited

U.S. PATENT DOCUMENTS 9,166,065 B2   10/2015   Ohsawa et al.
9,508,926 B2   11/2016   Kitagawa et al.
(Continued)

FOREIGN PATENT DOCUMENTS

CN           1732573 A       2/2006

OTHER PUBLICATIONS

U.S. Appl. No. 15/445,829; Title: "Semiconductor Device Having Rare Earth Oxide Layer and Method of Manufacturing the Same;", filed Feb. 28, 2017; First Named Inventor: Youngmin Eeh.

*Primary Examiner* — Charles D Garber
*Assistant Examiner* — Alia Sabur
(74) *Attorney, Agent, or Firm* — Holtz, Holtz & Volek PC

(57) ABSTRACT

According to one embodiment, a magnetic device comprising a magnetoresistive effect element, wherein the magnetoresistive effect element includes: a first ferromagnetic body, a second ferromagnetic body, and a first rare-earth ferromagnetic oxide that is provided between the first ferromagnetic body and the second ferromagnetic body and magnetically joins the first ferromagnetic body and the second ferromagnetic body.

18 Claims, 8 Drawing Sheets

(51) Int. Cl.
*H01F 10/30* (2006.01)
*G11C 11/16* (2006.01)

(56) References Cited

U.S. PATENT DOCUMENTS

| | | | |
|---|---|---|---|
| 2003/0053266 A1* | 3/2003 | Dieny | B82Y 10/00 |
| | | | 360/324 |
| 2003/0137785 A1* | 7/2003 | Saito | B82Y 10/00 |
| | | | 360/324.11 |
| 2007/0053113 A1 | 3/2007 | Papworth et al. | |
| 2011/0096443 A1* | 4/2011 | Zhang | C23C 14/165 |
| | | | 360/324.2 |
| 2013/0009260 A1* | 1/2013 | Apalkov | H01L 43/08 |
| | | | 257/421 |
| 2013/0242435 A1 | 9/2013 | Yuasa et al. | |
| 2016/0301002 A1* | 10/2016 | Hu | H01L 27/1052 |

* cited by examiner

| | S1 METAL/IRL/SEED | S2 REO/IRL/SEED | S3 REFMO/IRL/SEED |
|---|---|---|---|
| Removal of an impurity (increase of TMR and PMA) | Impossible | Possible | Possible |
| Magnetic joint between IRL and MRL (increase of retention characteristics) | Possible | Impossible | Possible |

MAGNETIC DEVICE

CROSS-REFERENCE TO RELATED APPLICATIONS

This application is based upon and claims the benefit of priority from Japanese Patent Application No. 2017-175925, filed Sep. 13, 2017, the entire contents of which are incorporated herein by reference.

FIELD

Embodiments described herein relate generally to a magnetic device.

BACKGROUND

Magnetic devices having magnetic elements are known.

DETAILED DESCRIPTION

Figure 1:
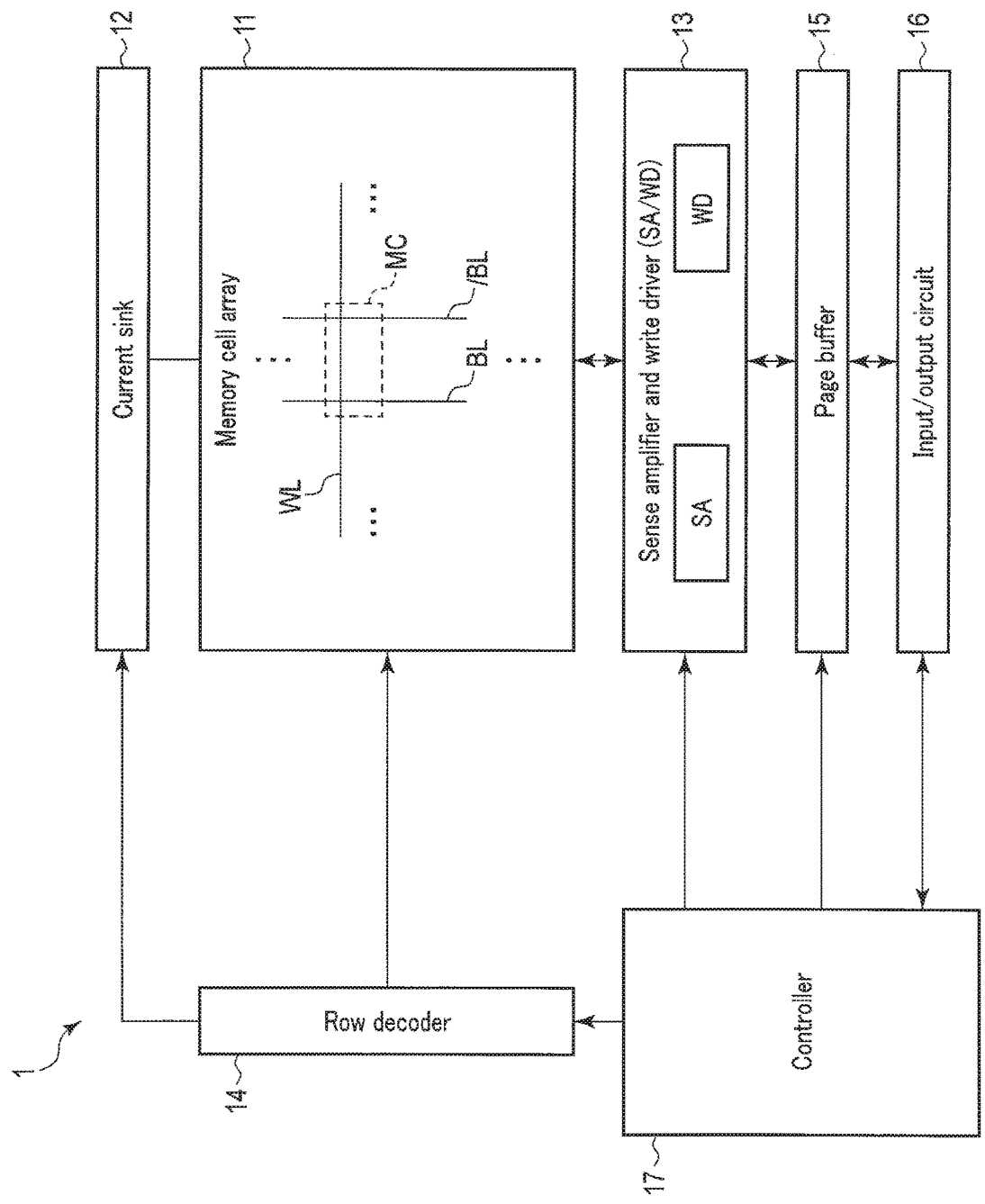
FIG. 1 is a block diagram illustrating a configuration of a magnetic device according to a first embodiment.

In general, according to one embodiment, a magnetic device comprising a magnetoresistive effect element, wherein the magnetoresistive effect element includes: a first ferromagnetic body, a second ferromagnetic body, and a first rare-earth ferromagnetic oxide that is provided between the first ferromagnetic body and the second ferromagnetic body and magnetically joins the first ferromagnetic body and the second ferromagnetic body.

Embodiments will be described below with reference to the accompanying drawings. Note that in the following description, common reference numerals denote components having the same functions and arrangements. To discriminate between a plurality of components having a common reference numeral, subscripts are added to the common reference numeral. Note that if it is not necessary to specifically discriminate between the plurality of components, the common reference numeral without any subscripts denotes the plurality of components.

1. First Embodiment

A magnetic device according to a first embodiment is described. The magnetic device according to the first embodiment includes, for example, a magnetic storage device by a perpendicular magnetization method using magnetoresistive (magnetic tunnel junction: MTJ) elements as storage elements.

In the following description, the above-described magnetic storage device will be described as an example of the magnetic device.

1.1. Re: Configuration

To begin with, a configuration of the magnetic device according to the first embodiment is described.

1.1.1. Re: Configuration of Magnetic Device

FIG. 1 is a block diagram illustrating the configuration of a magnetic device 1 according to the first embodiment. As illustrated in FIG. 1, the magnetic device 1 includes a memory cell array 11, a current sink 12, a sense amplifier and write driver (SA/WD) 13, a row decoder 14, a page buffer 15, an input/output circuit 16, and a controller 17.

The memory cell array 11 includes a plurality of memory cells MC which are associated with rows and columns. In addition, the memory cells MC on an identical row are connected to an identical word line WL, and both ends of the memory cells MC on an identical column are connected to an identical bit line BL and an identical source line/BL.

The current sink 12 is connected to the bit line BL and source line/BL. The current sink 12 sets the bit line BL or source line/BL at a ground potential in operations such as data write and read.

The SA/WD 13 is connected to the bit line BL and source line/BL. The SA/WD 13 supplies an electric current to the memory cell MC of an operation target via the bit line BL and source line/BL, and executes data write to the memory cell MC. In addition, the SA/WD 13 supplies an electric current to the memory cell MC of the operation target via the bit line BL and source line/BL, and executes data read from the memory cell MC. To be more specific, the write driver of the SA/WD 13 executes data write to the memory cell MC, and the sense amplifier of the SA/WD 13 executes data read from the memory cell MC.

The row decoder 14 is connected to the memory cell array 11 via the word line WL. The row decoder 14 decodes a row address which designates the row direction of the memory cell array 11. In addition, the row decoder 14 selects the word line WL in accordance with the decoded result, and applies to the selected word line WL a voltage which is necessary for operations such as data write and read.

The page buffer 15 temporarily stores, in units of data called "page", data which is to be written in the memory cell array 11, and data which was read from the memory cell array 11.

The input/output circuit 16 transmits various signals, which were received from the outside of the magnetic device 1, to the controller 17 and page buffer 15, and transmits various pieces of information from the controller 17 and page buffer 15 to the outside.

The controller 17 is connected to the current sink 12, SA/WD 13, row decoder 14, page buffer 15, and input/output circuit 16. The controller 17 controls the current sink 12, SA/WD 13, row decoder 14 and page buffer 15 in accordance with various signals which the input/output circuit 16 received from the outside of the magnetic device 1.

1.1.2. Re: Configuration of Memory Cell

Figure 2:
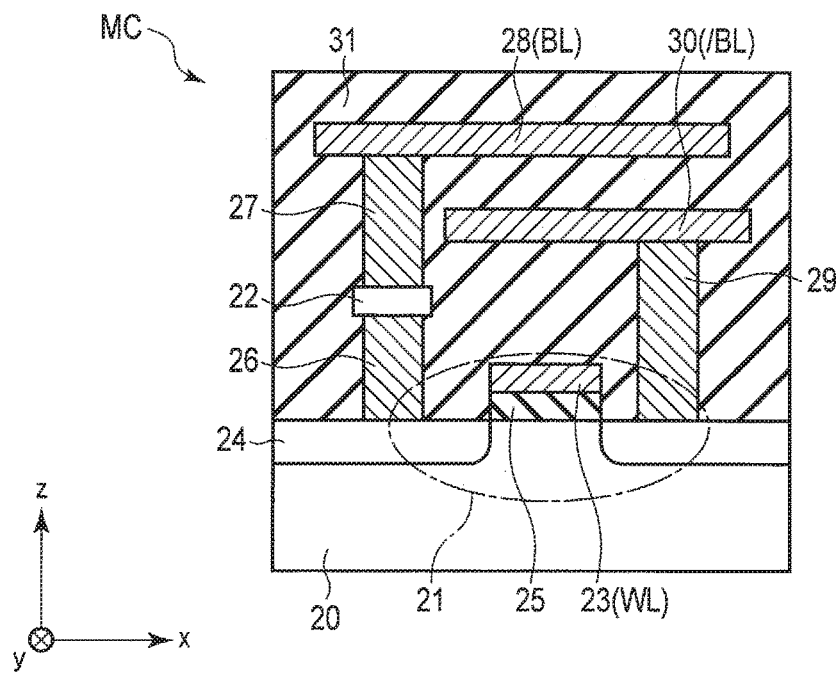
FIG. 2 is a cross-sectional view illustrating a configuration of a memory cell of the magnetic device according to the first embodiment.

Next, the configuration of the memory cell of the magnetic device according to the embodiment is described with reference to FIG. 2, in the description below, a plane parallel to a semiconductor substrate 20 is defined as an xy plane, and an axis perpendicular to the xy plane is defined as a z axis. An x axis and a y axis are defined as axes which are perpendicular to each other in the xy plane. FIG. 2 is a cross-sectional view in a case where the memory cell MC of the magnetic device 1 according to the embodiment is cut along the xz plane.

As illustrated in FIG. 2, the memory cell MC is provided on the semiconductor substrate 20, and includes a select transistor 21 and a magnetoresistive effect element 22. The select transistor 21 functions as a switch which controls the supply and stop of an electric current at a time of writing and reading data to and from the the magnetoresistive effect element 22. The magnetoresistive effect element 22 includes a plurality of stacked films, and the resistance value of the magnetoresistive effect element 22 can be switched between a low resistance state and a high resistance state by passing an electric current perpendicular to the film plane. The magnetoresistive effect element 22 functions as a memory element to which data can be written by a change of the resistance state of the magnetoresistive effect element 22, and the written data can be stored nonvolatilely and can be read.

The select transistor 21 includes a gate connected to a wiring layer 23 functioning as the word line WL, and a pair of source/drain regions 24 which are provided on a surface of the semiconductor substrate 20 at both ends of the gate in the x direction. Among the select transistor 21, a region included in the semiconductor substrate 20 is also referred to as an active region. The active region is insulated from each other by a STI (shallow trench isolation) so as not to be electrically connected to, for example, the active region of another memory cell MC.

The wiring layer 23 is provided along the y direction via an insulation film 25 on the semiconductor substrate 20, and is commonly connected to, for example, the gates of cell transistors 21 (not shown) of other memory cells MC which are arranged along the y direction. The wiring layers 23 are arranged, for example, in the x direction.

One end of the select transistor 21 is connected to a lower surface of the magnetoresistive effect element 22 via a contact plug 26 which is provided on the source region or drain region 24. A contact plug 27 is provided on an upper surface of the magnetoresistive effect element 22. The magnetoresistive effect element 22 is connected to a wiring layer 28 functioning as the bit line BL via the contact plug 27. The wiring layer 28 extends in the x direction, and is commonly connected to, for example, the other ends of magnetoresistive effect elements 22 (not shown) of other memory cells MC which are arranged in the x direction.

The other end of the select transistor 21 is connected to a wiring layer 30 functioning as the source line/BL via a contact plug 29 which is provided on the source region or drain region 24. The wiring layer 30 extends in the x direction, and is commonly connected to, for example, the other ends of cell transistors 21 (not shown) of other memory cells MC which are arranged in the x direction.

The wiring layers 28 and 30 are arranged, for example, in the y direction. The wiring layer 28 is located, for example, above the wiring layer 30. In the meantime, although illustration is omitted in FIG. 2, the wiring layers 28 and 30 are disposed, with mutual physical and electrical interferences being avoided. The select transistor 21, magnetoresistive effect element 22, wiring layers 23, 28, and 30, and contact plugs 26, 27, and 29 are covered with an interlayer insulation film 31.

In the meantime, other magnetoresistive effect elements 22 (not shown), which are arranged along the x direction or y direction in relation to the magnetoresistive effect element 22, are provided, for example, on the layer of the same level. Specifically, in the memory cell array 11, the plural magnetoresistive effect elements 22 are arranged, for example, in a direction of extension of the semiconductor substrate 20.

1.1.3. Re: Magnetoresistive Effect Element

Figure 3:
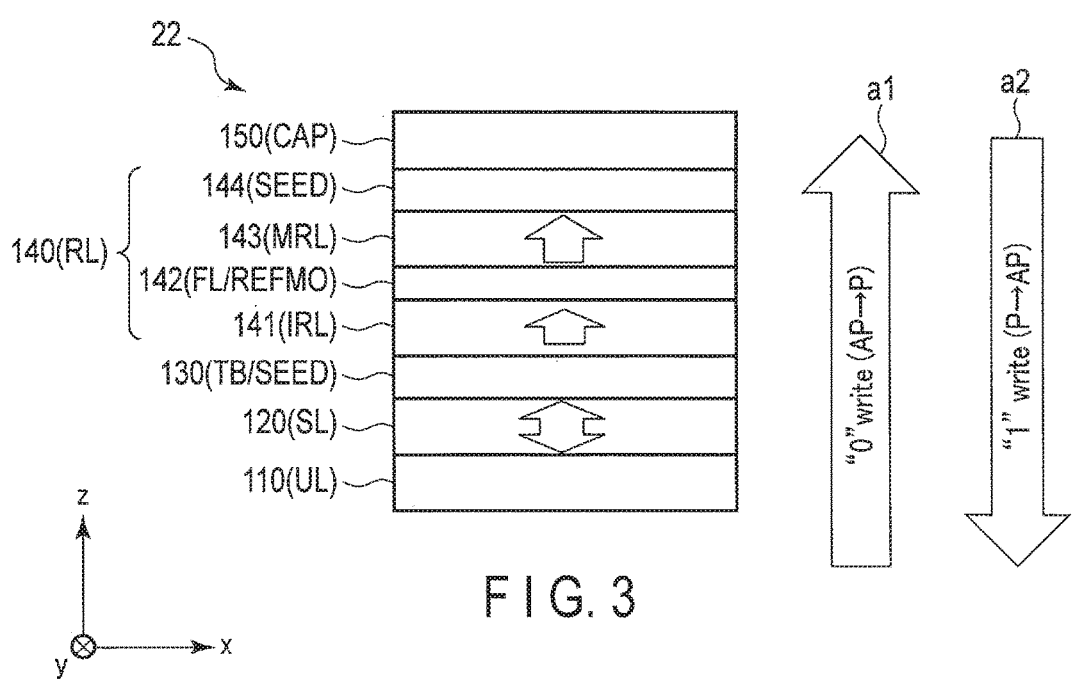
FIG. 3 is a cross-sectional view illustrating a configuration of a magnetoresistive effect element of the magnetic device according to the first embodiment.

Next, the configuration of the magnetoresistive effect element of the magnetic device according to the first embodiment will be described with reference to FIG. 3. FIG. 3 is an example of a cross-sectional view showing a cross section of the magnetoresistive effect element of the magnetic device according to the first embodiment cut along a plane perpendicular to the xy plane.

As shown in FIG. 3, the magnetoresistive effect element 22 includes: a non-magnetic layer 110 functioning as an under layer; a ferromagnetic layer 120 functioning as a storage layer; a non-magnetic layer 130 functioning as a tunnel barrier layer and a seed layer; a ferromagnetic layer 140 functioning as a reference layer; and a non-magnetic layer 150 functioning as a capping layer. In FIG. 3 and the following figures, the non-magnetic layer 110, the ferromagnetic layer 120, the non-magnetic layer 130, the ferromagnetic layer 140, and the non-magnetic layer 150 are also indicated as "UL," "SL," "TB/SEED," "RL," and "CAP," respectively.

In the magnetoresistive effect element 22, for example, a plurality of films, namely the non-magnetic layer 110, the ferromagnetic layer 120, the non-magnetic layer 130, the ferromagnetic layer 140, and the non-magnetic layer 150, are successively stacked in the z-axis direction from the semiconductor substrate 20 side. The magnetoresistive effect element 22 is a vertical magnetization-type MTJ element in which the magnetization directions of the ferromagnetic layers 120 and 140 are perpendicular to the film plane.

The non-magnetic layer 110 is a film of non-magnetic body, and includes at least one of nitrogen compounds or oxygen compounds, such as magnesium oxide (MgO), aluminum oxide (AlO), zinc oxide (ZnO), titanium oxide (TiO), magnesium nitride (MgN) zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The non-magnetic layer 110 may also include a mixture of aforementioned nitrogen compounds or oxygen compounds. Namely, the non-magnetic layer 110 may include not a binary compound made of two kinds of elements, but also a ternary compound made of three kinds of elements, such as aluminum titanium nitride (AlTiN). A nitrogen compound and an oxygen compound suppress an increase of a damping constant of a magnetic layer in contact with these compounds, and can achieve an effect of reducing a write current. Furthermore, by using a nitrogen compound or an oxygen compound that is a high-melting-point metal, it is possible to prevent a material of the under layer from diffusing to a magnetic layer and to prevent degradation of an MR ratio. In this description, the high-melting-point metal refers to a material having a melting point higher than that of iron (Fe) and cobalt (Co); and examples thereof are zirconium (Zr), hafnium (Hf), tungsten (W), chromium (Cr), molybdenum (Mo), niobium (Nb), titanium (Ti), tantalum (Ta), and vanadium (V).

The ferromagnetic layer 120 a layer of ferromagnetic body having a magnetization easy axis direction that is perpendicular to the film plane, and includes at least one of iron (Fe), cobalt (Co), or nickel (Ni). The ferromagnetic layer 120 may further include, as an impurity, at least one of boron (B), phosphorus (P), carbon (C), aluminum (Al), silicon (Si), tantalum (Ta), molybdenum (Mo), chromium (Cr), hafnium (Hf), tungsten (W), or titanium (Ti). More specifically, the ferromagnetic layer 120 may include cobalt-iron-boron (CoFeB) or iron boride (FeB), for example. The ferromagnetic layer 120 has a magnetization direction toward either the semiconductor substrate 20 side or the ferromagnetic layer 140 side. The magnetization direction of the ferromagnetic layer 120 is set to be reversed more easily than that of the ferromagnetic layer 140.

The non-magnetic layer 130 is non-magnetic body, and includes at least one of magnesium oxide (MgO), aluminum oxide (AlO), zinc oxide (ZnO), titanium oxide (TiO), or LSMO (lanthanum-strontium-manganese oxide), for example. The non-magnetic layer 130 functions as a seed layer to be a nucleus for growing a crystal film from an interface between the non-magnetic layer 130 and the ferromagnetic layers 120 and 140 in a crystallization treatment of the adjacent ferromagnetic layers 120 and 140. The crystallization treatment will be detailed later.

The ferromagnetic layer 140 is a layer of ferromagnetic body having a magnetization easy axis direction that is perpendicular to the film plane. The magnetization direction of the ferromagnetic layer 140 is fixed, and is directed toward either the ferromagnetic layer 120 or the non-magnetic layer 150 (in the example shown in FIG. 3, the magnetization direction of the ferromagnetic layer 140 is directed toward the non-magnetic layer 150). In this description, "magnetization direction is fixed" means that the magnetization direction does not change by an electric current with a magnitude that can reverse the magnetization direction of the ferromagnetic layer 120. By the non-magnetic layer 130 functioning as a tunnel barrier layer, the ferromagnetic layer 120, the non-magnetic layer 130, and the ferromagnetic layer 140 constitute a magnetic tunnel junction.

Also, the ferromagnetic layer 140 includes: a ferromagnetic layer 141 functioning as an interface reference layer; a rare-earth ferromagnetic oxide (REFMO) layer 142 functioning as a function layer; a ferromagnetic layer 143 functioning as a main reference layer; and a non-magnetic layer 144 functioning as a seed layer. In the ferromagnetic layer 140, for example, a plurality of films, namely the ferromagnetic layer 141, the rare-earth ferromagnetic oxide layer 142, the ferromagnetic layer 143, and the non-magnetic layer 144 are successively stacked in the z-axis direction from the semiconductor substrate 20 side. In FIG. 3 and the following figures, the ferromagnetic layer 141, the rare-earth ferromagnetic oxide layer 142, the ferromagnetic layer 143, and the non-magnetic layer 144 are also indicated as "IRL" "FL/REFMO," "MRL," and "SEED," respectively.

The ferromagnetic layer 141 is a layer of ferromagnetic body including at least one of iron (Fe), cobalt (Co), or nickel (Ni), in a manner similar to the ferromagnetic layer 120. The ferromagnetic layer 140 may further include at least one of the above-described impurities, in a manner similar to the ferromagnetic layer 120. More specifically, the ferromagnetic layer 141 may include cobalt-iron-boron (CoFeB) or iron boride (FeB), for example.

The rare-earth ferromagnetic oxide layer 142 is layer including a rare-earth oxide (REO), and includes an oxide of at least one of terbium (Tb), gadolinium (Gd), neodymium (Nd), yttrium (Y), samarium (Sm), promethium (Pm), thulium (Tm), scandium (Sc), cerium (Ce), europium (Eu), erbium (Er), holmium (Ho), lanthanum (La), ytterbium (Yb), lutetium (Lu), praseodymium (Pr), or dysprosium (Dy), for example. A rare-earth oxide has a crystal structure having a relatively wide space between elements. Therefore, if the ferromagnetic layers 141 and 143 adjacent to the rare-earth ferromagnetic oxide layer 142 are amorphous layers that include an impurity, the rare-earth ferromagnetic oxide layer 142 functions to diffuse the impurity into the rare-earth ferromagnetic oxide layer 142 in a high-temperature environment (e.g., annealing treatment). Namely, the rare-earth ferromagnetic oxide layer 142 functions to remove the impurity from the amorphous ferromagnetic layers 141 and 143 by the annealing treatment and turns them into a highly-oriented crystal condition. The annealing treatment will be detailed later.

The rare-earth ferromagnetic oxide layer 142 further includes an element having magnetic properties. Specifically, the rare-earth ferromagnetic oxide layer 142 further includes at least one of iron (Fe), cobalt (Co), nickel (Ni), or manganese (Mn). Therefore, if the rare-earth ferromagnetic oxide layer 142 is held between two ferromagnetic layers in a sandwiched manner, the rare-earth ferromagnetic oxide layer 142 also functions as a function layer that magnetically joins the two ferromagnetic layers. Namely, the rare-earth ferromagnetic oxide layer 142 magnetically joins the ferromagnetic layer 141 and the ferromagnetic layer 143.

The rare-earth ferromagnetic oxide layer 142 may further include at least one of the above-described impurities, in a manner similar to the ferromagnetic layers 120 and 141.

The rare-earth ferromagnetic oxide layer 142 preferably has a parasitic resistance smaller than that of the non-magnetic layer 130. More preferably, the parasitic resistance of the rare-earth ferromagnetic oxide layer 142 is equal or less than ten percent of that of the non-magnetic layer. For example, the rare-earth ferromagnetic oxide layer 142 is preferably a layer thinner than several nanometers (e.g., 2 nm).

The ferromagnetic layer 143 is a layer of ferromagnetic body having a magnetization easy axis direction that is perpendicular to the film plane, and, for example, has a magnetization direction that is parallel to the ferromagnetic layer 141 by being magnetically joined with the ferromagnetic layer 141. Therefore, the ferromagnetic layer 141, the rare-earth ferromagnetic oxide layer 142, the ferromagnetic layer 143, and the non-magnetic layer 144 can be regarded as one ferromagnetic layer having large perpendicular magnetization. The ferromagnetic layer 143 includes one of iron (Fe), cobalt (Co), or nickel (Ni), in a manner similar to the ferromagnetic layers 120 and 141, for example. The ferromagnetic layer 143 may further include at least one of the above-described impurities, in a manner similar to the ferromagnetic layer 120 and the ferromagnetic layer 141.

More specifically, the ferromagnetic layer 143 may include cobalt-iron-boron (CoFeB) or iron boride (FeB), for example.

The non-magnetic layer 144 is a film of non-magnetic body, and includes at least one of magnesium oxide (MgO), aluminum oxide (AlO), zinc oxide (ZnO), titanium oxide (TiO), or LSMO (lanthanum-strontium-manganese oxide), for example. The non-magnetic layer 144 may also include at least one of platinum (Pt), palladium (Pd), rhodium (Rh), ruthenium (Ru), iridium (Tr), or chromium (Cr). The non-magnetic layer 144 functions as a seed layer to be a nucleus for growing a crystal film from an interface between the non-magnetic layer 144 and the ferromagnetic layer 143 in a crystallization treatment of the ferromagnetic layer 143.

The non-magnetic layer 150 is non-magnetic body, and includes at least one of platinum (Pt), tungsten (W), tantalum (Ta), or ruthenium (Ru), for example.

In the first embodiment, a spin injection write method can be applied in which a write current is directly supplied to the magnetoresistive effect element 22, and the magnetization direction of the ferromagnetic layer 120 is controlled by The write current. The magnetoresistive effect element 22 can take either a low-resistance state or a high-resistance state, depending on whether the relative relationship between the magnetization directions of the ferromagnetic layers 120 and 140 parallel or antiparallel.

If a write current in the direction of an arrow a1 in FIG. 3, that is, in a direction from the ferromagnetic layer 120 toward the ferromagnetic layer 140, is passed through the magnetoresistive effect element 22, the relative relationship between the magnetization directions of the ferromagnetic layers 120 and 140 becomes parallel. In this parallel state, the resistance value of the magnetoresistive effect element 22 becomes lowest, and the magnetoresistive effect element 22 is set to a low-resistance state. This low-resistance state is called "P (Parallel) state", and is defined as a state of data "0", for instance.

If a write current in the direction of an arrow a2 in FIG. 3, that is, in a direction from the ferromagnetic layer 140 toward the ferromagnetic layer 120, is passed through the magnetoresistive effect element 22, the relative relationship between the magnetization directions of the ferromagnetic layers 120 and 140 becomes antiparallel. In this antiparallel state, the resistance value of the magnetoresistive effect element 22 becomes highest, and the magnetoresistive effect element 22 is set to a high-resistance state. This high-resistance state is called an "AP (Anti-Parallel) state", and is defined as a state of data "1", for instance.

1.2. Re: Method of Manufacturing Magnetoresistive Effect Element

Next, a method of manufacturing the magnetoresistive effect element of the magnetic device according to the first embodiment will be described. Hereinafter, a method of manufacturing the ferromagnetic layer 140 (reference layer RL) among the elements in the magnetoresistive effect element 22 is described, and a description of the other elements is omitted.

Figure 4:
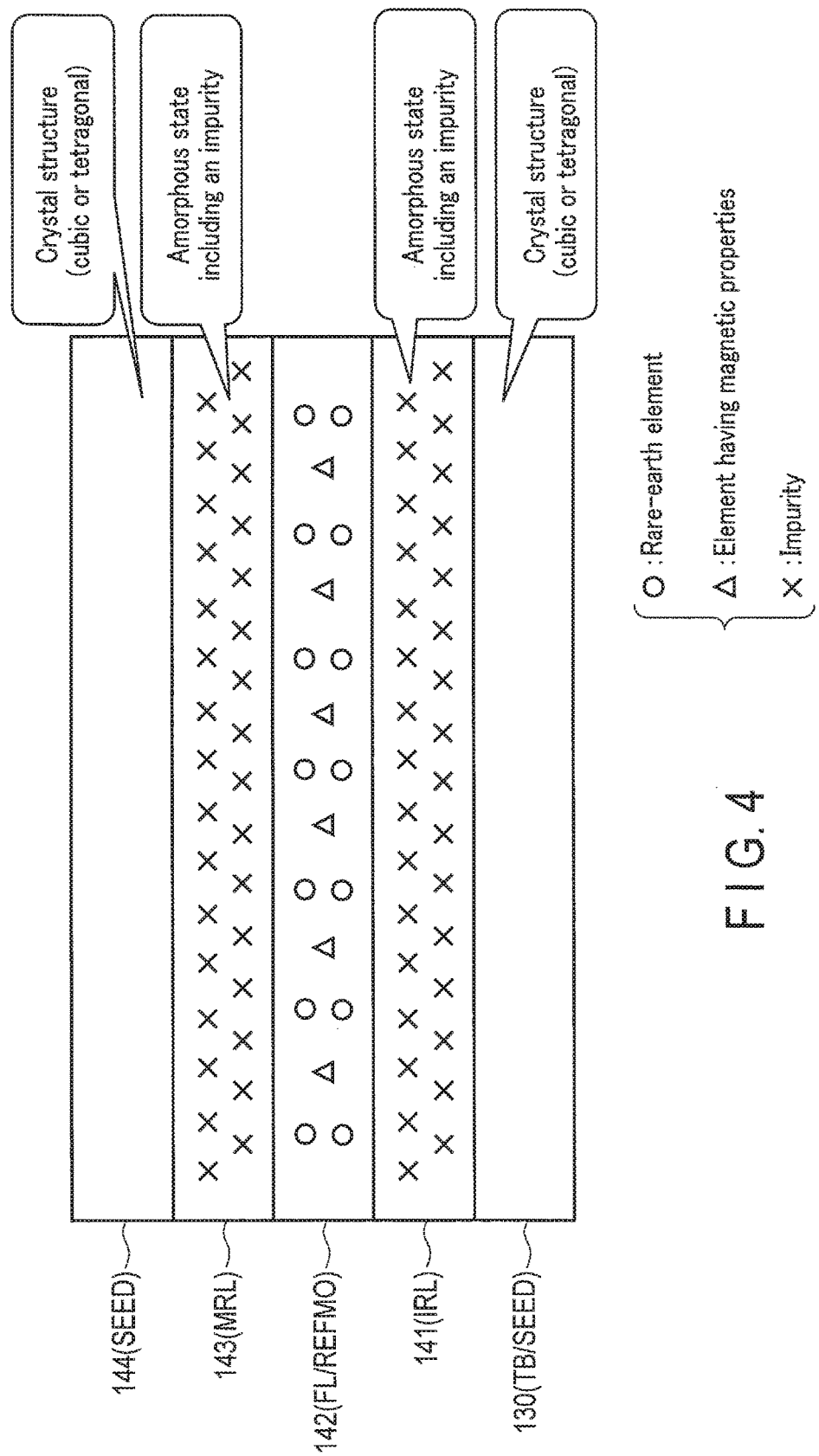
FIG. 4 is a schematic view illustrating a method of manufacturing the magnetoresistive effect element of the magnetic device according to the first embodiment.
Figure 5:
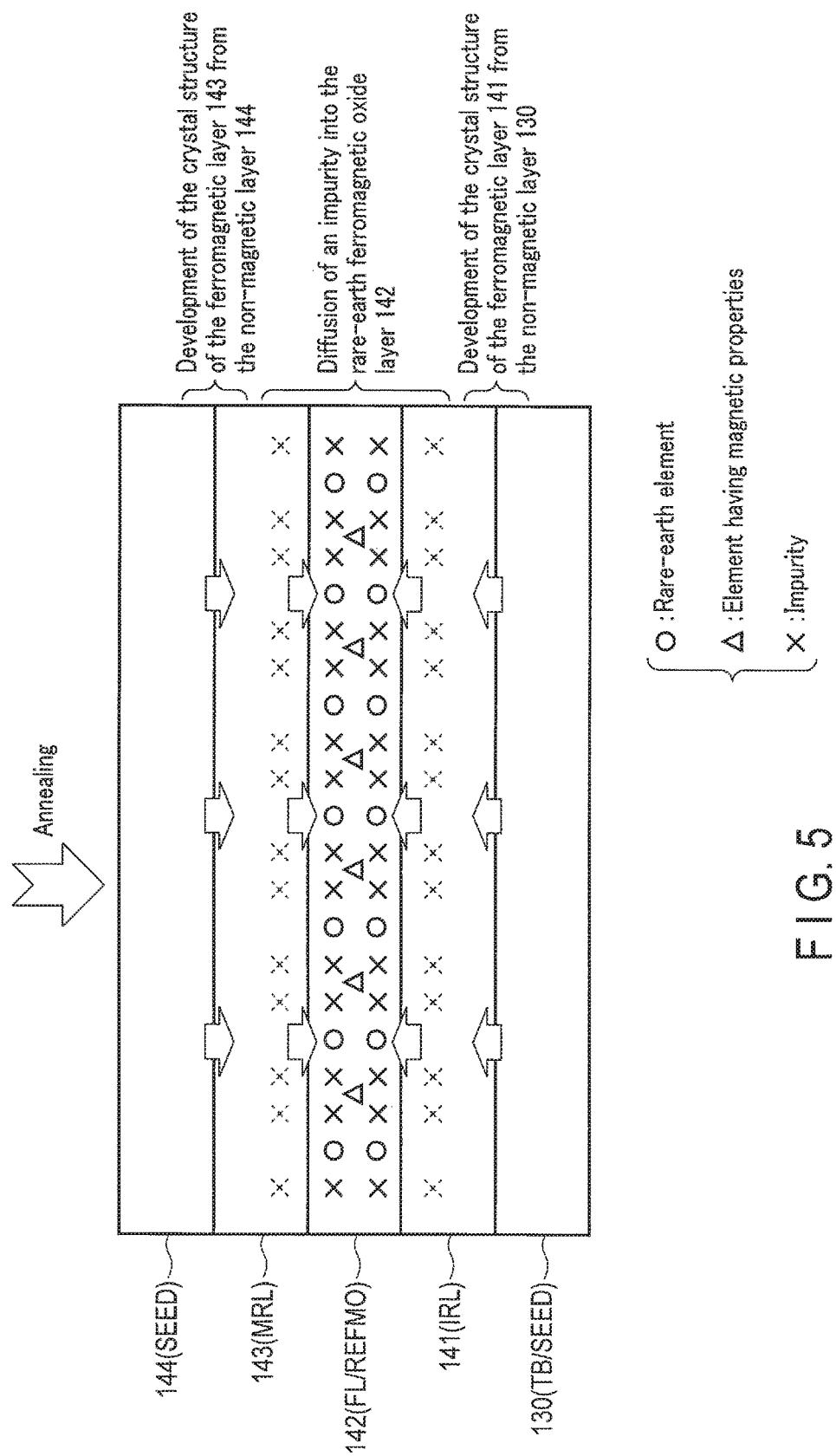
FIG. 5 is a schematic view illustrating the method of manufacturing the magnetoresistive effect element of the magnetic device according to the first embodiment.
Figure 6:
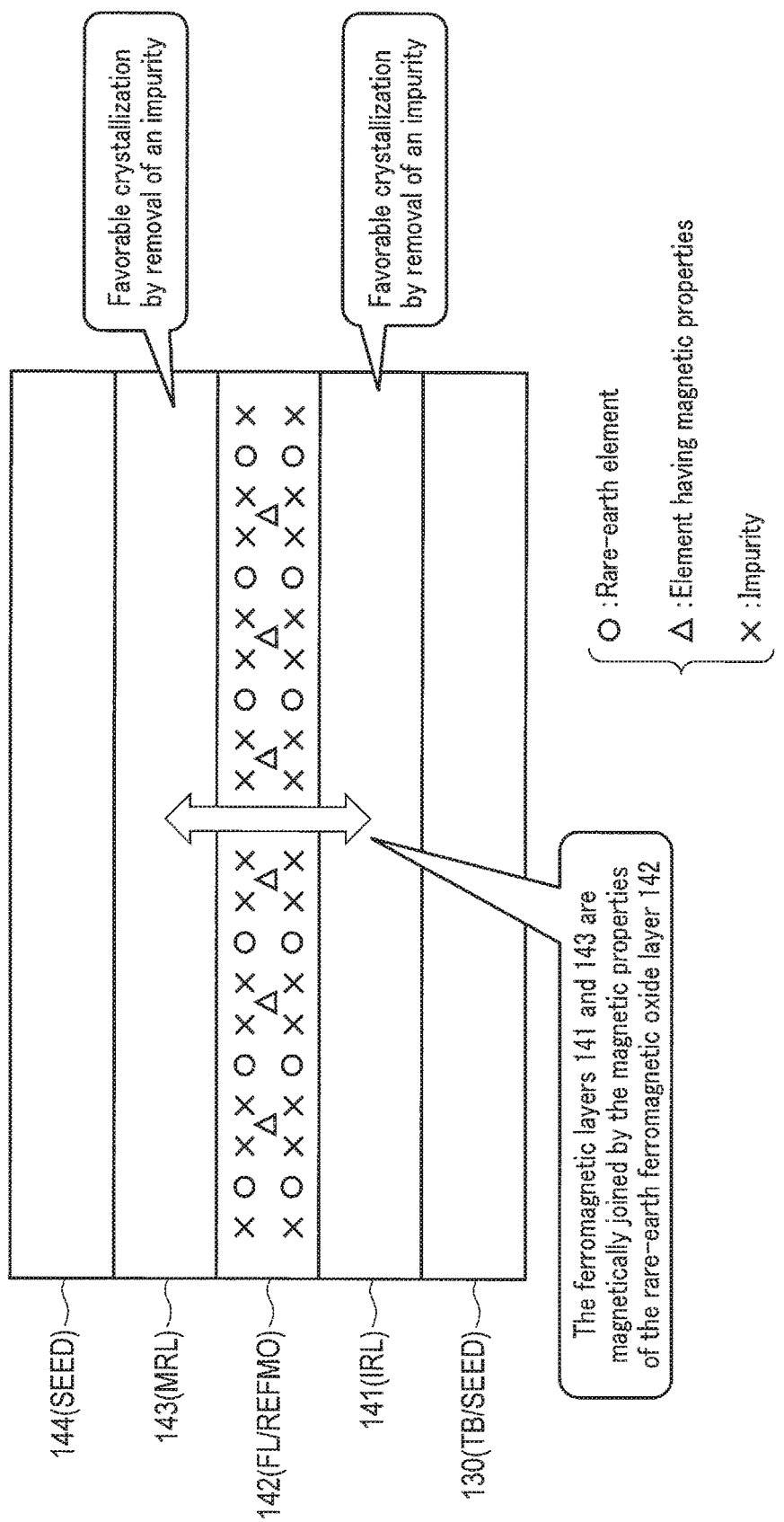
FIG. 6 is a schematic view illustrating the method of manufacturing the magnetoresistive effect element of the magnetic device according to the first embodiment.

FIGS. 4, 5, and 6 are schematic diagrams illustrating the method of manufacturing the magnetoresistive effect element of the magnetic device according to the first embodiment. FIGS. 4 to 6 show a process in which the ferromagnetic layers 141 and 143 in the ferromagnetic layer 140 change from an amorphous state to a crystal state by an annealing treatment.

As shown in FIG. 4, the non-magnetic layer 130, the ferromagnetic layer 141, the rare-earth ferromagnetic oxide layer 142, the ferromagnetic layer 143, and the non-magnetic layer 144 are stacked in the mentioned order. The ferromagnetic layers 141 and 143 are stacked as amorphous layers that include an impurity. The rare-earth ferromagnetic oxide layer 142 has a crystal structure that includes a rare-earth element and an element having magnetic properties.

In FIG. 4 and the following figures, a rare-earth element is represented by "○," an element having magnetic properties in the rare-earth ferromagnetic oxide layer 142 is represented by "Δ," and an impurity included in the ferromagnetic layers 141 and 143 at the time of stacking the layers is represented by "×," for convenience.

Next, the annealing treatment is performed on each layer stacked in FIG. 4, as shown in FIG. 5. Specifically, by applying heat to each layer from outside, the ferromagnetic layers 141 and 143 are transformed from amorphous to crystalline. Here, the non-magnetic layer 130 functions to control the orientation of the crystal structure of the ferromagnetic layer 141. Namely, the ferromagnetic layer 141 develops its crystal structure using the non-magnetic layer 130 as a seed (crystallization treatment). Thereby, the ferromagnetic layer 141 is oriented on the same crystal plane as the crystal plane of the non-magnetic layer 130.

The above-described development of the crystal structure of the ferromagnetic layer 141 from the non-magnetic layer 130 also performed between the ferromagnetic layer 143 and the non-magnetic layer 144 in a similar manner. Namely, the ferromagnetic layer 143 develops its crystal structure using the non-magnetic layer 144 as a seed. Thereby, the ferromagnetic layer 143 is oriented on the same crystal plane as the crystal plane of the non-magnetic layer 144, and is transformed from amorphous to crystalline.

In addition, as the ferromagnetic layers 141 and 143 have a crystal structure, the impurity included in the ferromagnetic layers 141 and 143 is diffused into the rare-earth ferromagnetic oxide layer 142. This can further promote the crystallization of the ferromagnetic layers 141 and 143.

Then, the annealing treatment ends, as shown in FIG. 6. Since the ferromagnetic layers 141 and 143 advance the crystallization in a state where most of the impurities have been removed, the ferromagnetic layers 141 and 143 crystallize favorably. Thereby, various properties, such as interface magnetic anisotropy, can be improved. Preferably, the impurity does not remain in the ferromagnetic layers 141 and 143; however, a small amount of impurity may remain in the layers. In this case, the ferromagnetic layers 141 and 143 and the rare-earth ferromagnetic oxide layer 142 include the same impurity.

Also, the ferromagnetic layers 141 and 143 are stacked, with the rare-earth ferromagnetic oxide layer 142 including an element having magnetic properties held therebetween. Therefore, the ferromagnetic layers 141 and 143 can magnetically join together in a subsequent magnetization step, and can act as one ferromagnetic layer as a whole. Namely, the ferromagnetic layer 141, the rare-earth ferromagnetic oxide layer 142, the ferromagnetic layer 143, and the non-magnetic layer 144 can act as one ferromagnetic layer 140 (reference layer RL). Thereby, it is possible to produce a reference layer RL having a structure in which a volume of a magnetic body is larger by the size of the ferromagnetic layer 143 than in a case of forming it only of the ferromagnetic layer 141.

Then, the production of the reference layer RL ends.

1.3. Re: Advantageous Effects of Present Embodiment

According to the first embodiment, the magnetoresistive effect element can obtain high retention characteristics while obtaining a high perpendicular magnetic anisotropy and magnetoresistive effect. Hereinafter, the effects will be described with reference to FIGS. 7 and 8.

Figures 7, 8:
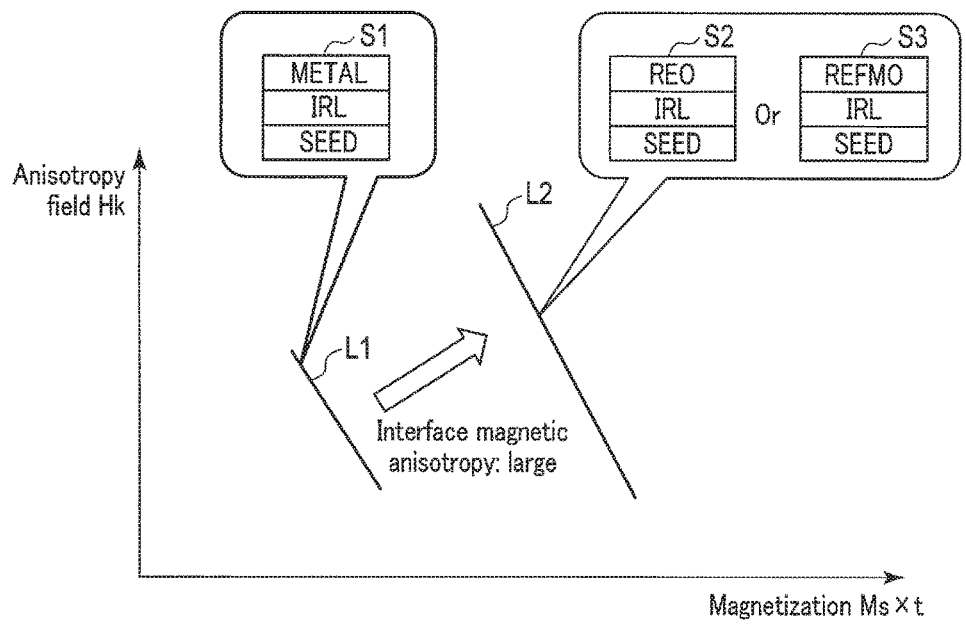
FIG. 7 is a diagram illustrating characteristics of the magnetoresistive effect element of the magnetic device according to the first embodiment.
FIG. 8 is a table illustrating the characteristics of the magnetoresistive effect element of the magnetic device according to the first embodiment.

FIGS. 7 and 8 are a diagram and a table, respectively, which illustrate characteristics of the magnetoresistive effect element of the magnetic device according to the first embodiment. In FIGS. 7 and 8, a comparison is made between the characteristics of the magnetoresistive effect element 22 described in the first embodiment and the characteristics of another magnetoresistive effect element having a different configuration.

In FIG. 7, the magnitude of the interface magnetic anisotropy of the interface reference layer IRL is compared. More specifically, in FIG. 7, the characteristics of three layered structures S1, S2, and S3 in a case of defining the horizontal axis as magnetization Ms×t and defining the vertical axis as an anisotropy field Hk are shown. Here, the magnetization Ms×t is a product of saturated magnetization Ms and a thickness t of the interface reference layer IRL. As the characteristics shown in FIG. 7 are positioned closer to the upper right (i.e., the magnetization Ms×t is larger, and the anisotropy field Hk is larger), it is indicated that the interface magnetic anisotropy of the interface reference layer IRL is larger.

In the descriptions provided below, a structure in which a seed layer SEED, an interface reference layer IRL, and a metal layer METAL are stacked in the mentioned order is referred to as a layered structure S1. Also, a structure in which a seed layer SEED, an interface reference layer IRL, and a rare-earth oxide layer REO are stacked in the mentioned order, and a structure in which a seed layer SEED, an interface reference layer IRL, and a rare-earth ferromagnetic oxide layer REFMO are stacked in the mentioned order, are referred to as layered structures S2 and S3, respectively. To be distinguished from the rare-earth ferromagnetic oxide layer REFMO, the rare-earth oxide layer REO is described as non-magnetic. Namely, the layered structure S3 corresponds to the structure included in the magnetoresistive effect element 22 according to the first embodiment.

As shown in FIG. 7, the layered structure S1 shows the characteristics indicated by the line L1. The layered structures S2 and S3 show the characteristics indicated by the line L2 positioned closer to the upper right than the line L1.

The rare-earth oxide layer REO has a crystal structure having a wide space between rare-earth elements, as described above. Therefore, when crystallizing the interface reference layer IRL in an amorphous state by performing the annealing treatment, the rare-earth oxide layer REO functions to take in an impurity in the interface reference layer IRL. In addition, the rare-earth oxide layer REO is a very stable oxide having a large absolute value of an oxide standard free energy of formation. Therefore, a gab between a rare-earth element and an oxygen element is less likely to occur in the annealing treatment. Accordingly, diffusion of an element from the rare-earth oxide layer REO into the interface reference layer IRL is inhibited. As a result, the interface reference layer IRL that contacts the rare-earth oxide layer REO can become a crystalline material with a higher orientation, and can eventually exhibit a high interface magnetic anisotropy.

The above-described characteristics hold true of a case where the rare-earth oxide layer REO is the rare-earth ferromagnetic oxide layer REFMO including a metal element having magnetic properties. Therefore, the rare-earth oxide layer REO and the rare-earth ferromagnetic oxide layer REFMO are represented by the line L2 that indicates an equivalent interface magnetic anisotropy.

On the other hand, a metal element in the metal layer METAL is likely to diffuse into the interface reference layer IRL, as compared to the rare-earth oxide layer REO and the rare-earth ferromagnetic oxide layer REFMO. Therefore, more impurities remain in the interface reference layer IRL that contacts the metal layer METAL than in the interface reference layer IRL that contacts the rare-earth oxide layer REO. Accordingly, the characteristics of the layered structure S1 are represented by the line L1 indicating an interface magnetic anisotropy smaller than that of the line L2 representing the characteristics of the layered structures S2 and S3.

In FIG. 7, the case where the interface reference layer IRL is stacked on an upper surface of the seed layer is described; however, the above-described characteristics hold true of a case where the order of stacking the layers is reversed. Namely, even if the interface reference layer IRL is stacked on a lower surface of the seed layer SEED, and the metal layer METAL, the rare-earth oxide layer REO, and the rare-earth ferromagnetic oxide layer REFMO are stacked on a lower surface of the interface reference layer IRL, characteristics similar to those described above in terms of the interface magnetic anisotropy are obtained.

In FIG. 8, two characteristics are compared as the characteristics of the magnetoresistive effect element 22. One of the two characteristics refers to a tunnel magnetoresistance (TMR) characteristic and a perpendicular magnetic anisotropy (PMA), and the other of the two characteristics refers to retention characteristics.

First, the tunnel magnetoresistance characteristic and the perpendicular magnetic anisotropy will be described. For example, the tunnel magnetoresistance characteristic and the perpendicular magnetic anisotropy correlate with the magnitude of the interface magnetic anisotropy. As detailed in FIG. 7, whereas the metal layer METAL inhibits crystallization of the interface reference layer IRL in the layered structure S1, the rare-earth oxide layer REO and the rare-earth ferromagnetic oxide layer REFMO can remove the impurity in the interface reference layer IRL in the layered structures S2 and S3. Therefore, the layered structures S2 and S3 can improve the tunnel magnetoresistance characteristic and the perpendicular magnetic anisotropy by enhancing the interface magnetic anisotropy further than the layered structure S1.

Next, the retention characteristics will be described. The "retention characteristics" means the difficulty in reversal of the resistance state of the magnetoresistive effect element 22 by external heat. For example, the retention characteristics can be quantitatively assessed by the magnitude of a magnetization energy $\Delta E$ represented by the following formula:

$$\Delta E = Ku \times Vol/(kB \times T) \approx Ms \times Hk \times A \times t/(kB \times T)$$

Here, Ku denotes anisotropic energy, and is represented by Ku=Ms×Hk. Ms and Hk denote saturated magnetization and anisotropy field, respectively. If the ferromagnetic layer can be regarded as a single-domain structure, the anisotropy field Hk can be approximate to Hc, as in Hk≈Hc. Hc denotes coercive force. Vol denotes a volume, and is represented by Vol=A×t. A and t denote a cross-sectional area along the xy plane, and a film thickness along the z-axis direction, respectively kB and T denote Boltzmann's constant and a temperature, respectively.

According to the above formula, the retention characteristics of the ferromagnetic layer against heat increase, as the volume Vol is larger (i.e., the film thickness t is larger).

The interface magnetic anisotropy (i.e., a value corresponding to a product of the anisotropy field Hk and the magnetization Ms×t) of the layered structure S1 is small, as compared to the layered structures S2 and S3, as described above; therefore, with only the interface reference layer IRL, the retention characteristics of the layered structure S1 are also small, as compared to the layered structures S2 and S3. However, if an element having magnetic properties is applied to the metal layer METAL, it is possible to magnetically join the interface reference layer IRL and a main reference layer MRL by further stacking the main reference layer MRL on an upper surface of the metal layer METAL. Thereby, the interface reference layer IRL and the main reference layer MRL can be regarded as one ferromagnetic layer, and accordingly, it is possible to obtain an effect of practically increasing the film thickness t, and eventually increase the magnetization energy ΔE. Therefore, the layered structure S1 can increase the retention characteristics by stacking the ferromagnetic layer.

With only the interface reference layer IRL, there is no difference in the volume Vol between the layered structures S2 and S31; therefore, the layered structures S2 and S3 have equal retention characteristics. However, since the rare-earth oxide layer REO does not have magnetic properties if not including an element having magnetic properties, is impossible to magnetically join the interface reference layer IRL and the main reference layer MRL, as in the above-described layered structure S1. As such, the layered structure S2 cannot obtain an effect of practically increasing the film thickness t, and therefore cannot increase the magnetization energy ΔE. Accordingly, the layered structure S2 cannot increase the retention characteristics by stacking the ferromagnetic layer.

On the other hand, since the rare-earth ferromagnetic oxide layer REFMO has magnetic properties, it is possible to magnetically join the interface reference layer IRL and the main reference layer MRL, as in the above-described layered structure S1. Therefore, the layered structure S3 can obtain an effect of practically increasing the film thickness t, and eventually increase the magnetization energy ΔE. Accordingly, the layered structure can increase the retention characteristics by stacking the ferromagnetic layer.

As described above, the layered structure S3 can obtain higher tunnel magnetoresistance characteristics and perpendicular magnetic anisotropy than those of the layered structure S1. The layered structure S3 can also obtain higher retention characteristics than those of the layered structure S2 by further stacking the main reference layer MRL on an upper surface of the rare-earth ferromagnetic oxide layer REFMO.

In the first embodiment, the magnetoresistive effect element 22 includes the ferromagnetic layer 141, the rare-earth ferromagnetic oxide layer 142, and the ferromagnetic layer 143. The ferromagnetic layers 141 and 143 are provided on a lower surface and on an upper surface of the rare-earth ferromagnetic oxide layer 142, respectively. Thereby, the ferromagnetic layers 141 and 143 can magnetically join together, and can be regarded as one ferromagnetic layer having a film thickness t that is practically larger than that of the single ferromagnetic layer 141. Therefore, it is possible to improve the retention characteristics of the reference layer RL, and also possible to inhibit reversal of the magnetization direction of the ferromagnetic layer 140 in a high-temperature environment in the subsequent reflow step, etc.

Also, in the magnetoresistive effect element 22, the non-magnetic layer 130 is provided on a lower surface of the ferromagnetic layer 141, and the non-magnetic layer 144 is provided on an upper surface of the ferromagnetic layer 143.

Thereby in the annealing treatment, the ferromagnetic layers 141 and 143 can develop the crystal thereof using the non-magnetic layers 130 and 144 as a seed, respectively. Therefore, the ferromagnetic layers 141 and 143 can be transformed from an amorphous state to a highly-oriented crystal state, and can eventually obtain high interface magnetic anisotropy.

Also, it is possible to diffuse the impurity in the ferromagnetic layers 141 and 143 into the rare-earth ferromagnetic oxide layer 142 in the annealing treatment. Therefore, it is possible to promote the crystallization of the ferromagnetic layers 141 and 143. Accordingly, the ferromagnetic layers 141 and 143 can finally obtain a high magnetoresistive effect and perpendicular magnetic anisotropy.

Also, the rare-earth ferromagnetic oxide layer 142 is designed to have a smaller parasitic resistance than that of the non-magnetic layer 130. Thereby, it is possible to suppress an excessive increase of the write current that is passed through the magnetoresistive effect element 22. Accordingly, the magnetoresistive effect element 22 can be easily applied to a magnetic storage device.

2. Modifications

The embodiments are not limited to the first embodiment described above, but can be modified in various ways.

2.1. First Modification

In the first embodiment, the example in which the ferromagnetic layer 140 includes the ferromagnetic layer 143 and the non-magnetic layer 144 is described; however, the embodiment is not limited thereto. For example, the ferromagnetic layer 140 may include a ferromagnetic layer 143a in place of the ferromagnetic layer 143 and the non-magnetic layer 144.

Hereinafter, only the matters different from the first embodiment will be described.

Figure 9:
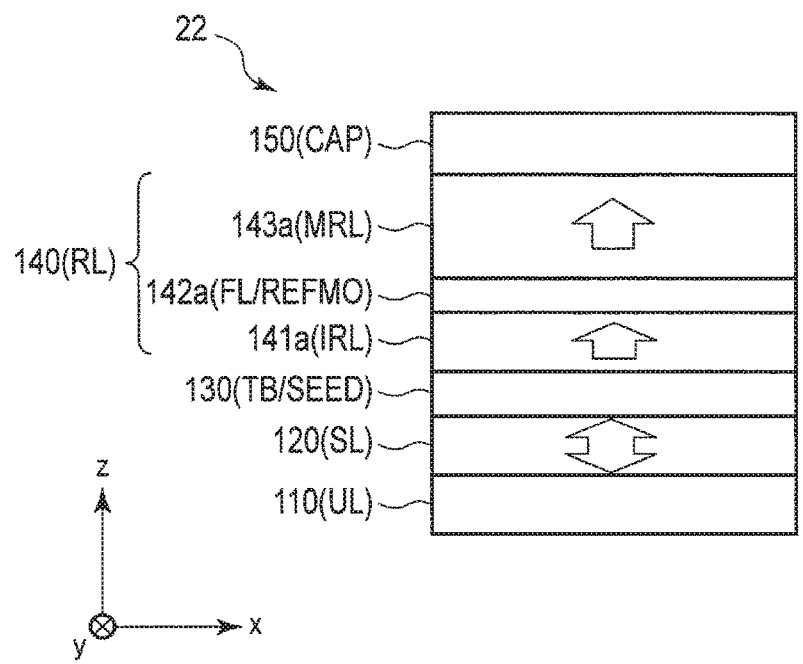
FIG. 9 is a cross-sectional view illustrating a configuration of a magnetoresistive effect element of a magnetic device according to a first modification of the first embodiment.

FIG. 9 is a cross-sectional view illustrating a configuration of a magnetoresistive effect element of a magnetic device according to a first modification of the first embodiment. FIG. 9 corresponds to FIG. 3 described in the first embodiment.

As shown in FIG. 9, the ferromagnetic layer 140 includes a ferromagnetic layer 141a, a rare-earth ferromagnetic oxide layer 142a, and the ferromagnetic layer 143a.

Since the ferromagnetic layer 141a and the rare-earth ferromagnetic oxide layer 142a are the same as the ferromagnetic layer 141 and the rare-earth ferromagnetic oxide layer 142 shown in FIG. 3, a description thereof is omitted.

The ferromagnetic layer 143a is a ferromagnetic layer having a magnetization easy axis direction that is perpendicular to the film plane, and has a magnetization direction that is parallel to the ferromagnetic layer 141a by being magnetically joined with the ferromagnetic layer 141a. Therefore, the ferromagnetic layers 141a, 142a, and 143a can be regarded as one ferromagnetic layer having a large perpendicular magnetization. The ferromagnetic layer 143a includes, for example, iron platinum (FePt), iron palladium (FePd), iron rhodium (FeRh), cobalt rhodium (CoRh), cobalt platinum (CoPt), cobalt nickel (CoNi), or cobalt palladium (CoPd). The ferromagnetic layer 143a includes, for example, a multi-layer film of the above-described compounds. Specifically, the ferromagnetic layer 143a includes, for example, a multi-layer film of iron (Fe) and platinum (Pt) (Fe/Pt multi-layer film), a multi-layer film of iron (Fe) and palladium (Pd) (Fe/Pd multi-layer film), a multi-layer film of iron (Fe) and rhodium (Rh) (Fe/Rh multi-layer film), a multi-layer film of cobalt (Co) and rhodium (Rh) (Co/Rh multi-layer film), a multi-layer film of cobalt (Co) and platinum (Pt) (Co/Pt multi-layer film), a multi-layer film of cobalt (Co) and nickel (Ni) (Co/Ni multi-layer film), or a multi-layer film of cobalt (Co) and palladium (Pd) (Co/Pd multi-layer film).

With the above-described configuration, the ferromagnetic layer 143a can be a ferromagnetic layer having a bulk magnetic anisotropy or a magnetic anisotropy by the multi-layer film, not the interface magnetic anisotropy. Therefore, it is unnecessary to perform the step of crystallizing the ferromagnetic layer 143a from an amorphous state in the annealing treatment to obtain the interface magnetic anisotropy, as in the case of the ferromagnetic layer 143 shown in FIG. 3. Also, since the crystallization is unnecessary, it is unnecessary to provide a seed layer for obtaining a highly-oriented crystal, as in the case of the non-magnetic layer 144 shown in FIG. 3.

The rare-earth ferromagnetic oxide layer 142a can magnetically join the ferromagnetic layers 141a and 143a, even if the ferromagnetic layer 143a is a ferromagnetic layer by a magnetic anisotropy other than the interface magnetic anisotropy. Therefore, the configuration of the first modification can also produce the same effect as that of the first embodiment.

2.2. Second Modification

In the first embodiment, the example in which the ferromagnetic layer 140 includes one rare-earth ferromagnetic oxide layer 142 is described; however, the embodiment is not limited thereto. For example, the ferromagnetic layer 140 may include a plurality of rare-earth ferromagnetic oxide layers.

Hereinafter, only the matters different from the first embodiment will be described.

Figure 10:
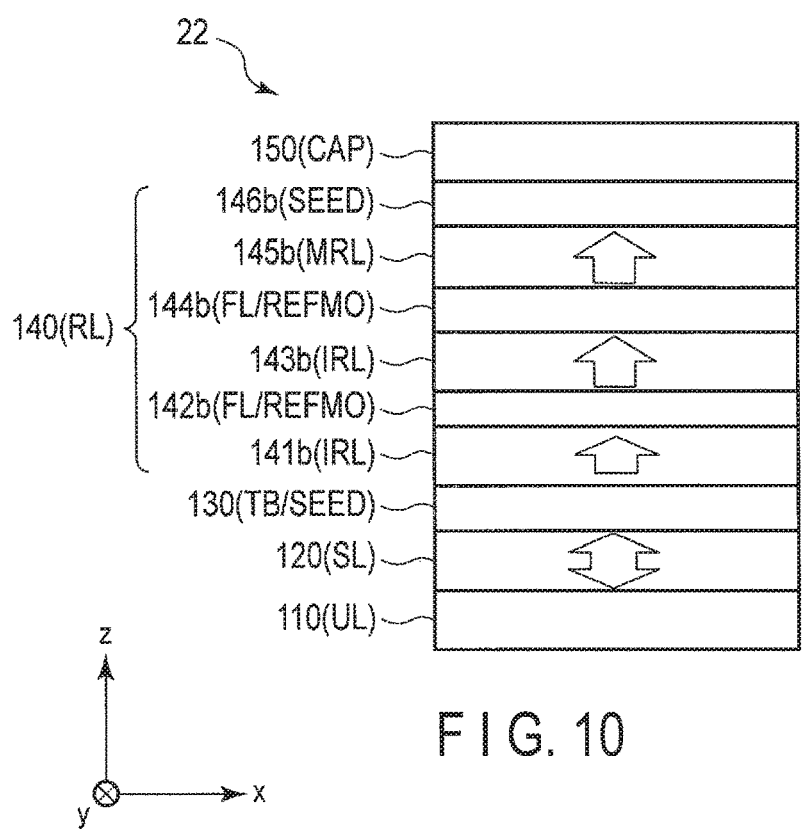
FIG. 10 is a cross-sectional view illustrating a configuration of a magnetoresistive effect element of a magnetic device according to a second modification of the first embodiment.

FIG. 10 is a cross-sectional view illustrating a configuration of a magnetoresistive effect element of a magnetic device according to a second modification of the first embodiment. FIG. 10 corresponds to FIG. 3 described in the first embodiment, and shows, as an example, a case of including two rare-earth ferromagnetic oxide layers in the ferromagnetic layer 140.

As shown in FIG. 10, the ferromagnetic layer 140 includes a ferromagnetic layer 141b, a rare-earth ferromagnetic oxide layer 142b, a ferromagnetic layer 143b, a rare-earth ferromagnetic oxide layer 144b, a ferromagnetic layer 145b, and a non-magnetic layer 146b.

Since the ferromagnetic layer 141b, the rare-earth ferromagnetic oxide layer 142b, and the ferromagnetic layer 143b are the same as the ferromagnetic layer 141, the rare-earth ferromagnetic oxide layer 142, and the ferromagnetic layer 143 shown in FIG. 3, a description thereof is omitted.

The rare-earth ferromagnetic oxide layer 144b is a layer including a rare-earth oxide, and includes at least one of the above-described rare-earth oxides in a manner similar to the rare-earth ferromagnetic oxide layer 142b. Therefore, if the ferromagnetic layers 143b and 145b adjacent to the rare-earth ferromagnetic oxide layer 144b are amorphous layers that include an impurity, the rare-earth ferromagnetic oxide layer 144b functions to diffuse the impurity into the rare-earth ferromagnetic oxide layer 144b in a high-temperature environment. Namely, the rare-earth ferromagnetic oxide layer 144b functions to remove the impurity from the amorphous ferromagnetic layers 143b and 145b by the annealing treatment and turns them into a highly-oriented crystal condition.

Also, the rare-earth ferromagnetic oxide layer 144b further includes at least one of iron (Fe), cobalt (Co), nickel (Ni) manganese (Mn), as an element having magnetic properties, in a manner similar to the rare-earth ferromagnetic oxide layer 142b. Therefore, if the rare-earth ferromagnetic oxide layer 144b is held between two ferromagnetic layers in a sandwiched manner, the rare-earth ferromagnetic oxide layer 144b also functions as a function layer that magnetically joins the two ferromagnetic layers. Namely, the rare-earth ferromagnetic oxide layer 144b magnetically joins the ferromagnetic layer 143b and the ferromagnetic layer 145b.

The rare-earth ferromagnetic oxide layer 144b may further include at least one of the above-described impurities, in a manner similar to the ferromagnetic layers 120, 141b, and 143b.

The rare-earth ferromagnetic oxide layer 144b is preferably thinner than the non-magnetic layer 130 to make the parasitic resistance small, in a manner similar to the rare-earth ferromagnetic oxide layer 142b.

The ferromagnetic layer 145b is a ferromagnetic layer having a magnetization easy axis direction that is perpendicular to the film plane, and has a magnetization direction that is parallel to the ferromagnetic layers 141b and 143b by being magnetically joined with the ferromagnetic layer 143b. Therefore, the ferromagnetic layers 141b to 145b can be regarded as one ferromagnetic layer having a large perpendicular magnetization. The ferromagnetic layer 145b includes one of iron (Fe), cobalt (Co), or nickel (Ni), in a manner similar to the ferromagnetic layers 120, 141b, and 143b, for example. The ferromagnetic layer 145b may further include at least one of the above-described impurities, in a manner similar to the ferromagnetic layers 120, 141b, and 143b.

Since the non-magnetic layer 146b is the same as the non-magnetic layer 144 shown in FIG. 3 a description thereof is omitted.

With the above-described configuration, the ferromagnetic layer 140 can magnetically join not only the two ferromagnetic layers 141b and 143b, but also the additional ferromagnetic layer 145b. Therefore, it is possible to further increase the practical film thickness t of the ferromagnetic layer 140, and eventually further improve the retention characteristics of the ferromagnetic layer 140.

2.3. Third Modification

In the first embodiment, the example in which the ferromagnetic layer 140 includes the rare-earth ferromagnetic oxide layer 142 in the magnetoresistive effect element 22 is described; however, the embodiment is not limited thereto. For example, the magnetoresistive effect element 22 may include a rare-earth ferromagnetic oxide layer not only in the ferromagnetic layer 140 but also in the ferromagnetic layer 120.

Hereinafter, only the matters different from the first embodiment will be described.

Figure 11:
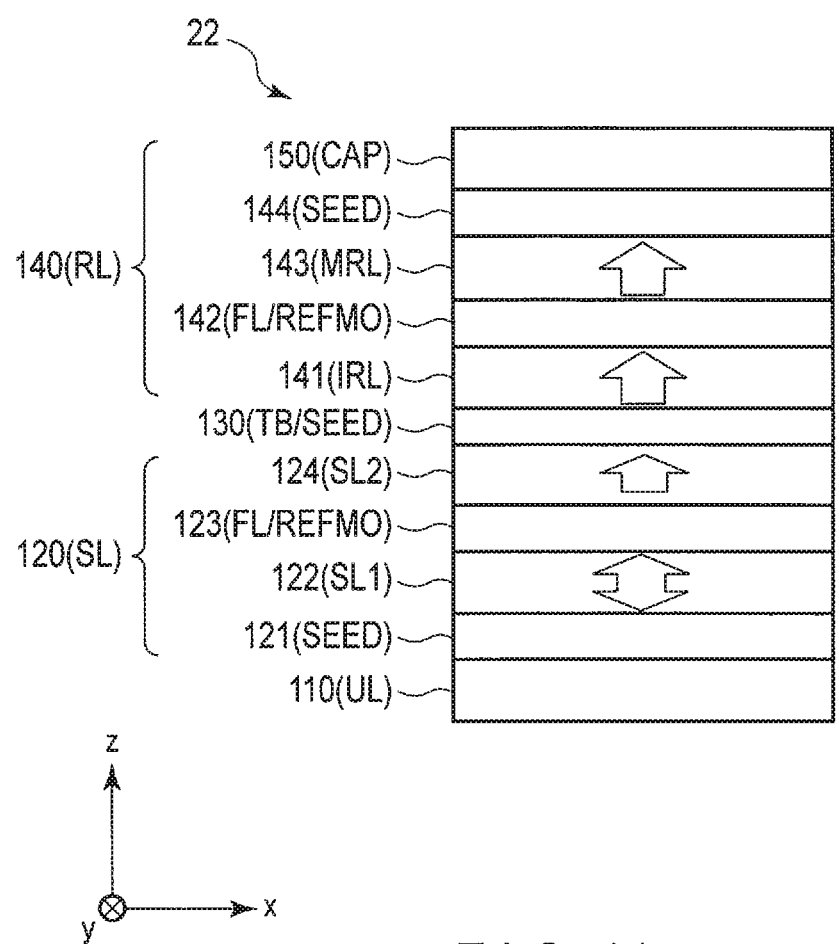
FIG. 11 is a cross-sectional view illustrating a configuration of a magnetoresistive effect element of a magnetic device according to a third modification of the first embodiment.

FIG. 11 is a cross-sectional view illustrating a configuration of a magnetoresistive effect element of a magnetic device according to a third modification of the first embodiment. FIG. 11 corresponds to FIG. 3 described in the first embodiment, and shows a case of including a rare-earth ferromagnetic oxide layer in the ferromagnetic layer 120 as well.

As shown in FIG. 11, the ferromagnetic layer 120 includes a non-magnetic layer 121 functioning as a seed layer, a ferromagnetic layer 122 functioning as a part of a storage layer, a rare-earth ferromagnetic oxide layer 123 functioning as a function layer, and a ferromagnetic layer 124 functioning as a part of a storage layer. In the ferromagnetic layer 120, for example, a plurality of films, namely the non-magnetic layer 121, the ferromagnetic layer 122, the rare-earth ferromagnetic oxide layer 123, and the ferromagnetic layer 124 are successively stacked in the z-axis direction from the semiconductor substrate 20 side. In FIG. 11, the non-magnetic layer 121, the ferromagnetic layer 122, the rare-earth ferromagnetic oxide layer 123, and the ferromagnetic layer 124 are also indicated as "SEED," "SL1," "FL/REFMO," and "SL2," respectively.

The non-magnetic layer 121, for example, has structure similar to that of the non-magnetic layer 144. The non-magnetic layer 121 functions as a seed layer to be a nucleus for growing a crystal film from an interface between the non-magnetic layer 121 and the ferromagnetic layer 122 in a crystallization treatment of the ferromagnetic layer 122.

The ferromagnetic layer 122, for example, has structure similar to that of the ferromagnetic layer 141.

The rare-earth ferromagnetic oxide layer 123, for example, has a structure similar to that of the rare-earth ferromagnetic oxide layer 142. If the ferromagnetic layers 122 and 124 adjacent to the rare-earth ferromagnetic oxide layer 123 are amorphous layers that include an impurity, the rare-earth ferromagnetic oxide layer 123 functions to diffuse the impurity into the rare-earth ferromagnetic oxide layer 123 in a high-temperature environment. Namely, the rare-earth ferromagnetic oxide layer 123 functions to remove the impurity from the amorphous ferromagnetic layers 122 and 124 by the annealing treatment and turns them into a highly-oriented crystal condition. Also, the rare-earth ferromagnetic oxide layer 123 magnetically joins the ferromagnetic layer 122 and the ferromagnetic layer 124.

The rare-earth ferromagnetic oxide layer 123 is preferably thinner than the non-magnetic layer 130 to make the parasitic resistance small, in a manner similar to the rare-earth ferromagnetic oxide layer 142.

The ferromagnetic layer 124 is a ferromagnetic layer having a magnetization easy axis direction that is perpendicular to the film plane, and has a magnetization direction that is parallel to the ferromagnetic layer 122 by being magnetically joined with the ferromagnetic layer 122. Therefore, the non-magnetic layer 121, the ferromagnetic layer 122, the rare-earth ferromagnetic oxide layer 123, and the ferromagnetic layer 124 can be regarded as one ferromagnetic layer having a large perpendicular magnetization. The ferromagnetic layer 124, for example, has a structure similar to that of the ferromagnetic layer 122.

With the above-described configuration, the ferromagnetic layer 120 can also obtain a high magnetoresistive effect and perpendicular magnetic anisotropy, and obtain high retention characteristics, in a manner similar to the ferromagnetic layer 140.

3. Others

In the first embodiment and each of the modifications, the case is described where the magnetoresistive effect element 22 is of the bottom free type in which the storage layer SL is provided on the semiconductor substrate 20 side. However, this may be of a top free type in which the reference layer RL is provided on the semiconductor substrate 20 side.

Also, in the second modification, the case is described in which two rare-earth ferromagnetic oxide layers and three ferromagnetic layers are alternately stacked; however, the number of stacked layers may be further increased. For example, n rare-earth ferromagnetic oxide layer (s) and (n+1) ferromagnetic layers may be alternately stacked (n is any natural number).

Furthermore, in the first embodiment and each of the modifications, the magnetic storage device including an MTJ element is described as an example of the magnetic device including the magnetoresistive effect element; however, the magnetic device is not limited thereto. For example, the magnetic device includes another device that requires magnetic element having perpendicular magnetic anisotropy, such as a sensor or media. The magnetic element is, for example, an element that includes at least the ferromagnetic layer 141, the rare-earth ferromagnetic oxide layer 142, and the ferromagnetic layer 143 described in FIG. 3. If the non-magnetic layer 130 is further provided in contact with the magnetic element, the non-magnetic layer 130 is not limited to the insulator described in the first embodiment and each of the modifications, but may be an electrical conductor. Specifically, the non-magnetic layer 130 may include, for example, at least one of platinum (Pt), palladium (Pd), rhodium (Rh), ruthenium (Ru), iridium (Ir), or chromium (Cr).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic device comprising a magnetoresistive effect element, wherein the magnetoresistive effect element comprises:
    a first ferromagnetic body;
    a second ferromagnetic body;
    a first rare-earth ferromagnetic oxide that is provided between the first ferromagnetic body and the second ferromagnetic body and magnetically joins the first ferromagnetic body and the second ferromagnetic body; and
    a first seed,
    wherein the first ferromagnetic body is provided between the first seed and the first rare-earth ferromagnetic oxide, and
    wherein a parasitic resistance of the first rare-earth ferromagnetic oxide is smaller than a parasitic resistance of the first seed.

2. The magnetic device according to claim 1, wherein the magnetoresistive effect element further comprises:
    a third ferromagnetic body; and
    a second rare-earth ferromagnetic oxide that is provided between the second ferromagnetic body and the third ferromagnetic body and magnetically joins the second ferromagnetic body and the third ferromagnetic body.

3. The magnetic device according to claim 1, wherein the first rare-earth ferromagnetic oxide comprises:
    one of terbium (Tb), gadolinium (Gd), neodymium (Nd), yttrium (Y), samarium (Sm), promethium (Pm), thulium (Tm), scandium (Sc), cerium (Ce), europium (Eu), erbium (Er), holmium (Ho), lanthanum (La), ytterbium (Yb), lutetium (Lu), praseodymium (Pr), or dysprosium (Dy); and
    one of iron (Fe), cobalt (Co), nickel (Ni), or manganese (Mn).

4. The magnetic device according to claim 3, wherein the first rare-earth ferromagnetic oxide further comprises one of boron (B), phosphorus (P), carbon (C), aluminum (Al), silicon (Si), tantalum (Ta), tungsten (W), molybdenum (Mo), chromium (Cr), hafnium (Hf), or titanium (Ti).

5. The magnetic device according to claim 1, wherein the first ferromagnetic body and the second ferromagnetic body comprise one of iron (Fe), cobalt (Co), or nickel (Ni).

6. The magnetic device according to claim 1, wherein:
the magnetoresistive effect element further comprises a second seed; and
the second ferromagnetic body is provided between the second seed and the first rare-earth ferromagnetic oxide.

7. The magnetic device according to claim 1, wherein:
the second ferromagnetic body comprises a plurality of layers, each of which comprises one of cobalt (Co), iron (Fe), palladium (Pd), rhodium (Rh), or platinum (Pt).

8. The magnetic device according to claim 1, wherein the first seed comprises one of magnesium oxide (MgO), aluminum oxide (AlO), zinc oxide (ZnO), titanium oxide (TiO), or lanthanum strontium manganese oxide (LSMO).

9. The magnetic device according to claim 1, wherein the first seed comprises one of platinum (Pt), palladium (Pd), rhodium (Rh), ruthenium (Ru), iridium (Ir), or chromium (Cr).

10. The magnetic device according to claim 1, further comprising a memory cell including the magnetoresistive effect element.

11. A method of manufacturing the magnetic device of claim 1, comprising:
forming a layered body comprising the first ferromagnetic body, the second ferromagnetic body, the first rare-earth ferromagnetic oxide, wherein the first ferromagnetic body and the second ferromagnetic body are amorphous and include an impurity;
transforming the first ferromagnetic body and the second ferromagnetic body from an amorphous state to a crystalline state by annealing; and
magnetically joining the first ferromagnetic body and the second ferromagnetic body transformed into the crystalline state by a magnetic property of the first rare-earth ferromagnetic oxide.

12. The manufacturing method according to claim 11, wherein the first rare-earth ferromagnetic oxide comprises:
one of terbium (Tb), gadolinium (Gd), neodymium (Nd), yttrium (Y), samarium (Sm), promethium (Pm), thulium (Tm), scandium (Sc), cerium (Ce), europium (Eu), erbium (Er), holmium (Ho), lanthanum (La), ytterbium (Yb), lutetium (Lu), praseodymium (Pr), or dysprosium (Dy); and
one of iron (Fe), cobalt (Co), nickel (Ni), or manganese (Mn).

13. The manufacturing method according to claim 11, wherein the first ferromagnetic body and the second ferromagnetic body comprise one of iron (Fe), cobalt (Co), or nickel (Ni).

14. The manufacturing method according to claim 11, wherein the first rare-earth ferromagnetic oxide does not include the impurity before the annealing, and includes the impurity diffused from the first ferromagnetic body and the second ferromagnetic body after the annealing.

15. The manufacturing method according to claim 14, wherein the impurity further comprises one of boron (B), phosphorus (P), carbon (C), aluminum (Al), silicon (Si), tantalum (Ta), tungsten (W), molybdenum (Mo), chromium (Cr), hafnium (Hf), or titanium (Ti).

16. The manufacturing method according to claim 11, wherein the first seed is provided on the first ferromagnetic body.

17. The manufacturing method according to claim 16, wherein the first seed comprises one of magnesium oxide (MgO), aluminum oxide (AlO), zinc oxide (ZnO), titanium oxide (TiO), or lanthanum strontium manganese oxide (LSMO).

18. The manufacturing method according to claim 16, wherein the first seed comprises one of platinum (Pt), palladium (Pd), rhodium (Rh), ruthenium (Ru), iridium (Ir), or chromium (Cr).

* * * * *